(12) United States Patent
Wang et al.

(10) Patent No.: US 11,049,899 B2
(45) Date of Patent: Jun. 29, 2021

(54) ENCAPSULATION STRUCTURE OF IMAGE SENSING CHIP, AND ENCAPSULATION METHOD THEREFOR

(71) Applicant: China Wafer Level CSP Co., Ltd., Jiangsu (CN)

(72) Inventors: Zhiqi Wang, Jiangsu (CN); Zhiming Geng, Jiangsu (CN)

(73) Assignee: China Wafer Level CSP Co., Ltd., Jiangsu (CN)

( * ) Notice: Subject to any disclaimer, the term of this patent is extended or adjusted under 35 U.S.C. 154(b) by 38 days.

(21) Appl. No.: 16/612,606

(22) PCT Filed: Jul. 6, 2018

(86) PCT No.: PCT/CN2018/094766
§ 371 (c)(1),
(2) Date: Nov. 11, 2019

(87) PCT Pub. No.: WO2019/007412
PCT Pub. Date: Jan. 10, 2019

(65) Prior Publication Data
US 2020/0303448 A1 Sep. 24, 2020

(30) Foreign Application Priority Data

Jul. 6, 2017 (CN) .......................... 201710547345.2
Jul. 6, 2017 (CN) .......................... 201720812265.0

(51) Int. Cl.
*H01L 27/146* (2006.01)
*H01L 25/04* (2014.01)
(Continued)

(52) U.S. Cl.
CPC ...... *H01L 27/14685* (2013.01); *H01L 25/042* (2013.01); *H01L 27/14607* (2013.01);
(Continued)

(58) Field of Classification Search
CPC ............. H01L 25/042; H01L 27/14603; H01L 27/14607; H01L 27/14623;
(Continued)

(56) References Cited

U.S. PATENT DOCUMENTS

2003/0215056 A1* 11/2003 Vuorela ............ H01L 27/14634
378/62
2005/0275048 A1 12/2005 Farnworth et al.
(Continued)

FOREIGN PATENT DOCUMENTS

CN 101236944 A 8/2008
CN 106024823 A 10/2016
(Continued)

OTHER PUBLICATIONS

PCT/CN2018/094766, Sep. 27, 2018, International Search Report and Written Opinion.
(Continued)

*Primary Examiner* — Stephen W Smoot
(74) *Attorney, Agent, or Firm* — Wolf, Greenfield & Sacks, P.C.

(57) ABSTRACT

A structure and a method for packaging an image sensor chip. The structure includes: an image sensor chip and a substrate. The image sensor chip includes a first surface and a second surface that are opposite to each other, and the first surface is provided with multiple pixels configured to collect image information and multiple first bonding pads connected with the multiple pixels. The substrate covers the first surface of the image sensor chip, and is provided with wiring and a contact terminal connected with the wiring. A periphery of the image sensor chip is bonded to the substrate via an anisotropic conductive adhesive, the multiple first bonding pads are electrically connected with the contact terminal via the anisotropic conductive adhesive, and the anisotropic (Continued)

conductive adhesive surrounds all the multiple pixels and is not overlapped with the multiple pixels in a direction perpendicular to the substrate.

20 Claims, 11 Drawing Sheets

(51) Int. Cl.
*H01L 31/0203* (2014.01)
*H01L 31/18* (2006.01)

(52) U.S. Cl.
CPC .. *H01L 27/14623* (2013.01); *H01L 27/14636* (2013.01); *H01L 27/14687* (2013.01); *H01L 31/0203* (2013.01); *H01L 31/1876* (2013.01)

(58) Field of Classification Search
CPC ......... H01L 27/14625; H01L 27/14632; H01L 27/14634; H01L 27/14636; H01L 27/14685; H01L 27/14687; H01L 27/1469; H01L 31/02005; H01L 31/02019; H01L 31/0203; H01L 31/022408; H01L 31/02325; H01L 31/16; H01L 31/167; H01L 31/1876
See application file for complete search history.

(56) References Cited

U.S. PATENT DOCUMENTS

| | | | | |
|---|---|---|---|---|
| 2007/0252227 A1* | 11/2007 | Fukuda | ............. | H01L 27/14618 |
| | | | | 257/432 |
| 2011/0291215 A1* | 12/2011 | Tu | ..................... | H01L 27/14685 |
| | | | | 257/433 |
| 2019/0258019 A1* | 8/2019 | Ohara | ............... | H01L 27/14625 |

FOREIGN PATENT DOCUMENTS

| | | |
|---|---|---|
| CN | 106653790 A | 5/2017 |
| CN | 107170769 A | 9/2017 |

OTHER PUBLICATIONS

International Search Report and Written Opinion for International Application No. PCT/CN2018/094766, dated Sep. 27, 2018.

* cited by examiner

ENCAPSULATION STRUCTURE OF IMAGE SENSING CHIP, AND ENCAPSULATION METHOD THEREFOR

This Application is a national stage filing under 35 U.S.C. § 371 of International Patent Application Serial No. PCT/CN2018/094766, filed Jul. 6, 2018, which claims priority to Chinese application number 201710547345.2, filed Jul. 6, 2017 and Chinese application number 201720812265.0, filed Jul. 6, 2017 with the China National Intellectual Property Administration, all of these applications are incorporated herein by reference in their entirety.

FIELD

The present disclosure relates to the technical field of image acquisition device, and in particular, to a structure and a method for encapsulating an image sensor chip.

BACKGROUND

An image sensor chip is an electronic device capable of sensing external light and converting the external light into electrical signals. The image sensor chip is usually fabricated by a semiconductor manufacturing technique. After an image sensor chip is fabricated, a series of packaging processes is performed on the image sensor chip to form a packaged structure. Thereby, it can be applied to various kinds of electronic equipment such as a digital camera and a digital video camera.

During the process of packaging an image sensor chip in conventional technology, a bonding pad on a surface of the image sensor chip and a bonding pad on a substrate are generally soldered together, and the image sensor chip is sealed and fixed by the peripheral substrate via an adhesive.

It can be seen that it is necessary to use the adhesive for bonding and fixing after soldering, during packaging the image sensor chip according to convention technology. The process is complex, and the cost is high.

SUMMARY

To solve the above problems, a structure and a method for packaging an image sensor chip are provided according to embodiments of the present disclosure. Thereby the image sensor chip is packaged with a simple process and a reduced manufacturing cost.

To achieve the above objective, following technical solutions are provided according to embodiments of the present disclosure.

A structure for packaging an image sensor chip is provided, including:

an image sensor chip, where the image sensor chip includes a first surface and a second surface that are opposite to each other, and the first surface is provided with multiple pixels configured to collect image information and multiple first bonding pads connected with the multiple pixels; and a substrate covering the first surface of the image sensor chip, where the substrate is provided with wiring and a contact terminal connected with the wiring, and the wiring is configured to electrically connect with an external circuit;

where a periphery of the image sensor chip is bonded to the substrate via an anisotropic conductive adhesive, the multiple first bonding pads are electrically connected with the contact terminal via the anisotropic conductive adhesive, and the anisotropic conductive adhesive surrounds all the multiple pixels and is not overlapped with the multiple pixels in a direction perpendicular to the substrate.

Preferably, in the aforementioned structure for packaging, the substrate includes a first region and a second region surrounding the first region, where the first region is a transparent region;

the first surface of the image sensor chip includes a collecting region and a non-collecting region surrounding the collecting region, where the collecting region faces the first region, and the multiple first bonding pads are located in the non-collecting region; and the anisotropic conductive adhesive is located between the non-collecting region and the second region.

Preferably, in the aforementioned structure for packaging, the substrate is made of a transparent material.

Preferably, in the aforementioned structure for packaging, the wiring is located on a surface of the second region that faces the image sensor chip, and a light shielding layer is provided between the wiring and the substrate.

Preferably, in the aforementioned structure for packaging, the substrate is made of a non-transparent material, where the first region is provided with an opening running through the substrate, and the opening is configure to expose all the multiple pixels.

Preferably, the aforementioned structure for packaging further includes a transparent cover plate fixedly arranged on the substrate, where the transparent cover plate covers the opening.

Preferably, in the aforementioned structure for packaging, an external connection terminal is arranged on a surface of the substrate that faces the image sensor chip, where the external connection terminal is electrically connected with the wiring, and the external connection terminal is configured to electrically connect with the external circuit.

Preferably, in the aforementioned structure for packaging, the external circuit includes a socket, and the external connection terminal is a pin matching with the socket, and the wiring is connected with the external circuit through plugging the pin into the socket.

Preferably, the aforementioned structure for packaging further includes a light compensation apparatus arranged on a surface of the substrate that is away from the image sensor chip.

Preferably, in the aforementioned structure for packaging, the multiple first bonding pads are evenly arranged along the periphery of the image sensor chip.

Preferably, in the aforementioned structure for packaging, the first surface of the image sensor chip is provided with multiple auxiliary pads, where the multiple auxiliary pads are identical to the multiple first bonding pads in shape, and the multiple auxiliary pads and the multiple first bonding pads are evenly arranged along the peripheral of the image sensor chip.

Preferably, in the aforementioned structure for packaging, the multiple auxiliary pads and the multiple first bonding pads are located along a periphery of a rectangle, where the multiple first bonding pads are evenly arranged along two opposite sides of the rectangle, and the multiple auxiliary pads are evenly arranged along another two opposite sides of the rectangle.

Preferably, in the packaging structure, the multiple auxiliary pads and the multiple first bonding pads are located along a periphery of a rectangle, where the multiple first bonding pads and the multiple auxiliary pads are arranged along the periphery of the rectangle in an alternating manner.

A method for packaging an image sensor chip is further provided according to an embodiment of the present disclosure, and the method is configured to manufacture the packaging structure stated above. The method includes:

providing a plate, where the plate includes multiple packaging regions arranged in an array, a cutting channel is provided among adjacent ones of the multiple packaging regions, each of the multiple packaging regions is provided with the wiring and the contact terminal connected with the wiring, and the wiring is configured to electrically connect with the external circuit;

bonding the image sensor chip at each of the multiple packaging regions via the anisotropic conductive adhesive, where the image sensor chip includes the first surface and the second surface that are opposite to each other, and the first surface is provided with the multiple pixels configured to collect image information and the multiple first bonding pads connected with the multiple pixels;

cutting the plate along the cutting channel, to form multiple structures for packaging the image sensor chip, where the plate is divided into multiple substrates in the cutting, and each of the multiple substrates includes one of the multiple packaging regions;

where the periphery of the image sensor chip is bonded to the substrate via the anisotropic conductive adhesive, the multiple first bonding pads are electrically connected with the contact terminal via the anisotropic conductive adhesive, and for each of the multiple packaging regions, the anisotropic conductive adhesive surrounds all the multiple pixels and is not overlapped with the multiple pixels in a direction perpendicular to said packaging region.

Preferably, in the aforementioned method for packaging, each of the multiple packaging regions includes a first region and a second region surrounding the first region, where the first region is a transparent region; the first surface of the image sensor chip includes a collecting region and a non-collecting region surrounding the collecting region, where the collecting region faces the first region, and the multiple first bonding pads are located in the non-collecting region; and bonding the image sensor chip at each of the multiple packaging regions via the anisotropic conductive adhesive includes:

coating the anisotropic conductive adhesive on a periphery of each of the multiple packaging regions, adhering the image sensor chip to the anisotropic conductive adhesive, and performing a hot-pressing consolidation process on the anisotropic conductive adhesive, to fix the image sensor chip to the substrate via the anisotropic conductive adhesive and electrically connect the image sensor chip to the first bonding pads;

where the anisotropic conductive adhesive is located between the non-collecting region and the second region.

Preferably, in the aforementioned method for packaging, the multiple substrates are made of a transparent material; and providing the plate includes:

forming a light shielding layer with a preset pattern structure on a surface of the plate, where the light shielding layer with the preset pattern structure is provided with openings in a one-to-one correspondence to the first regions, and the opening is configured to expose the corresponding first region; and forming the wiring and the contact terminal on a surface of the light shielding layer that is away from the plate.

Preferably, in the aforementioned method for packaging, the substrate is made of a non-transparent material, and providing a plate includes:

forming, at the first region of each of the multiple packaging regions, an opening running through said packaging region, where the opening is configured to expose all the multiple pixels.

Preferably, the aforementioned method for packaging further includes: fixing a transparent cover plate on each of the openings.

Preferably, before cutting the plate along the cutting channel, the aforementioned method for packaging further includes: providing a light compensation apparatus on a surface of each of the multiple packaging regions that is away from the image sensor chip.

Preferably, before cutting the plate along the cutting channel, the aforementioned method for packaging further includes: forming an external connection terminal electrically connected with the wiring at each of the multiple packaging regions, where the external connection terminal is configured to electrically connect with the external circuit, and the external connection terminal and the image sensor chip are located at a same side of the plate.

Based on the above description, in the structure and the method for packaging the image sensor chip according to the embodiments of the present disclosure, the first bonding pad of the image sensor chip is directly and electrically connected with the contact terminal of the substrate via the anisotropic conductive adhesive, and the substrate is bonded to the image sensor chip via the anisotropic conductive adhesive. Compared to the conventional technology of packaging an image sensor chip which requires soldering and adhering, technical solutions of the present disclosure has a simple process and a lower manufacturing cost in packaging the image sensor chip.

BRIEF DESCRIPTION OF THE DRAWINGS

For clearer illustration of the technical solutions according to embodiments of the present disclosure or conventional technology, the drawings involved in description of the embodiments according to the present disclosure or conventional technology are briefly described hereinafter. Apparently, the drawings in the following descriptions only illustrate some embodiments of the present disclosure, and other drawings may be obtained by those skilled in the art based on the drawings without any inventive efforts.

DETAILED DESCRIPTION

Hereinafter the technical solutions according to the embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any inventive effort fall within the scope of protection of the present disclosure.

To make the object, technical solutions and advantages of the present application clearer, the technical solutions according to the embodiments of the present application will be described clearly and completely as follows in conjunction with the drawings in the embodiments of the present application.

Figure 1:
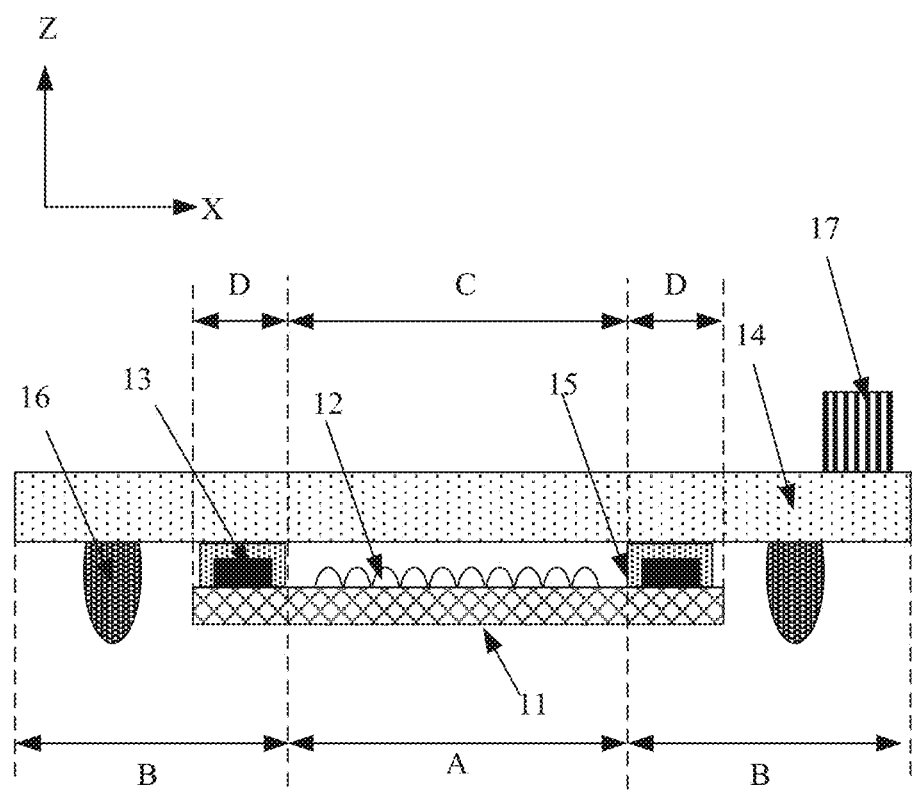
FIG. 1 is a schematic diagram of a structure for packaging an image sensor chip according to an embodiment of the present disclosure.
Figure 2:
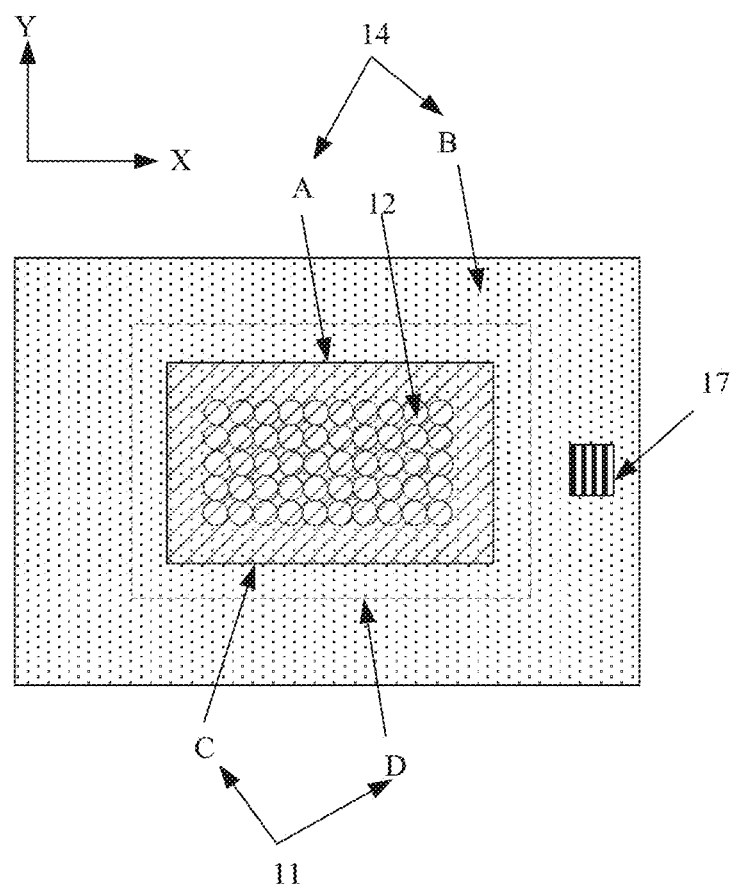
FIG. 2 is a top view of the packaging structure in FIG. 1 from a direction opposite to a first direction Z.
Figure 3:
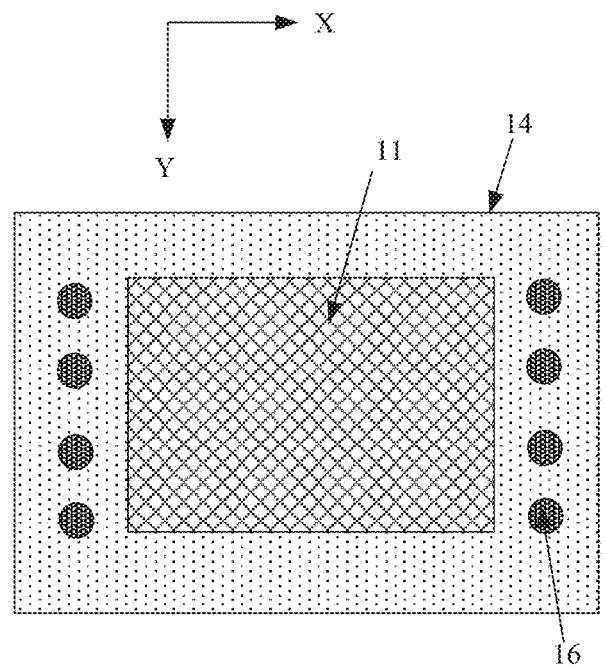
FIG. 3 is a top view of the packaging structure in FIG. 1 from a first direction Z.

Reference is made to FIGS. 1 to 3. FIG. 1 is a schematic diagram of a structure for packaging an image sensor chip according to an embodiment of the present disclosure, FIG. 2 is a top view of the packaging structure in FIG. 1 from a direction opposite to a first direction Z, and FIG. 3 is a top view of the packaging structure in FIG. 1 from a first direction Z.

A structure for packaging includes an image sensor chip 11 and a substrate 14. The image sensor chip 11 includes a first surface and a second surface that are opposite to each other. The first surface is provided with multiple pixels 12 configured to collect image information and multiple first bonding pads 13 connected with the multiple pixels. The substrate 14 covers the first surface of the image sensor chip 11. The substrate 14 is provided with wiring and a contact terminal connected with the wiring, and the wiring is configured to electrically connect with an external circuit. The wiring includes a first interconnection wiring that is configured to electrically connect the multiple pixels 12 to the external circuit. The external circuit performs image processing based on the image information acquired by the multiple pixels 12.

A periphery of the image sensor chip 11 is bonded to the substrate 14 via an anisotropic conductive adhesive 15. The first bonding pads 13 are electrically connected with the contact terminal via the anisotropic conductive adhesive 15. In a direction perpendicular to the substrate 14, the anisotropic conductive adhesive 15 surrounds all the pixels 12 and is not overlapped with the pixels 12. The wiring and the contact terminal are not shown in FIGS. 1 to 3.

In one embodiment, the direction perpendicular to the substrate 14 is defined as a first direction Z, and the first direction Z points from the image sensor chip 11 to the substrate 14 from. A second direction X and a third direction Y are both perpendicular to the first direction Z, and the second direction X is perpendicular to the third direction Y. Both the second direction X and the third direction Y are parallel to the substrate 14.

The substrate 14 includes a first region A and a second region B surrounding the first region A. The first region A is a transparent region. The first surface of the image sensor chip 11 includes a collecting region C and a non-collecting region D surrounding the collecting region C. The collecting region C faces the first region A. The first bonding pads 13 are located in the non-collecting region D. The anisotropic conductive adhesive 15 is located between the non-collecting region D and the second region B.

In the first direction Z, the first region A completely exposes the collecting region C. Optionally, the first region A and the collecting region C may be identical.

In this embodiment as shown in FIGS. 1 to 3, the substrate 14 is made of the transparent material. Thus, light may directly irradiate the collecting region C of the image sensor chip 11 through the first region A. The substrate 14 may be a glass substrate or a transparent plastic substrate, in a case that the substrate is made of the transparent material.

The wiring is located on a surface of the second region B that faces the image sensor chip 11. A light shielding layer is provided between the wiring and the substrate 14.

The contact terminal is located on a surface of the light shielding layer that is away from the substrate 14. The light shielding layer is arranged at a side of the substrate 14 that faces the image sensor chip 14, so as to prevent the light shielding layer from being damaged by friction. The light shielding layer shields the wiring and the contact terminal, so as to ensure that the wiring and the contact terminal is not shown from appearance of the structure for packaging. The light shielding layer is not shown in FIGS. 1 to 3. Optionally, the light shielding layer may be a black ink layer.

An external connection terminal 16 that is electrically connected with the wiring is arranged on a surface of the substrate 14 that faces the image sensor chip 11. The external connection terminal 16 is configured to electrically connect with the external circuit, so as to make the external circuit to be electrically connected with the pixels 12 of the image sensor chip 11. In the first direction Z, the external connection terminal 16 is located in a position at the substrate 14 that corresponds to the second region B, and is not overlapped with the image sensor chip 11.

In one embodiment as shown in FIG. 1, the external connection terminal 16 is a solder ball. In another embodiment, the external connection terminal 16 may be a bonding pad. In a case that the external connection terminal 16 is a solder ball or a bonding pad, the external connection terminal 16 may be soldered to a bonding pad of the external circuit, so as to make the external circuit electrically connect with the wiring.

In some embodiments, the external circuit is provided with a socket. The external connection terminal 16 may be a pin matching with the socket. Thus, the wiring is connected with the external circuit through plugging the pin into the socket.

To ensure an imaging quality of the structure under weak illumination, the structure for packaging according to one embodiment of the present disclosure further includes a light compensation apparatus 17 arranged on a surface of the substrate 14 that is away from the image sensor chip 11. In the first direction Z, the light compensation apparatus 17 is located in a position of the substrate 14 that corresponds to the second region B. Optionally, the light compensation apparatus 17 may be an LED device. Operations of the light compensation apparatus may be controlled by the external circuit. The wiring further includes a second interconnection wiring that is configured to electrically connect the light compensation apparatus to the external circuit. The second interconnection wiring is insulated from the first interconnection wiring.

The light compensation apparatus 17 may be connected with the contact terminal located on the surface of the substrate 14 that faces the image sensor chip 11, via a through hole running through the substrate 14, and thereby connected with the external circuit. Alternatively, the light compensation apparatus 17 may be connected with the contact terminal located at another side of the substrate 14 via a flexible printed circuit.

In the embodiment, the substrate 14 is made of a transparent material. Thus, the first region A is transparent. The substrate 14 packages the image sensor chip 11, electrically connects with the external circuit, and meanwhile can be used as a cover plate of the image sensor chip 11.

Figure 4:
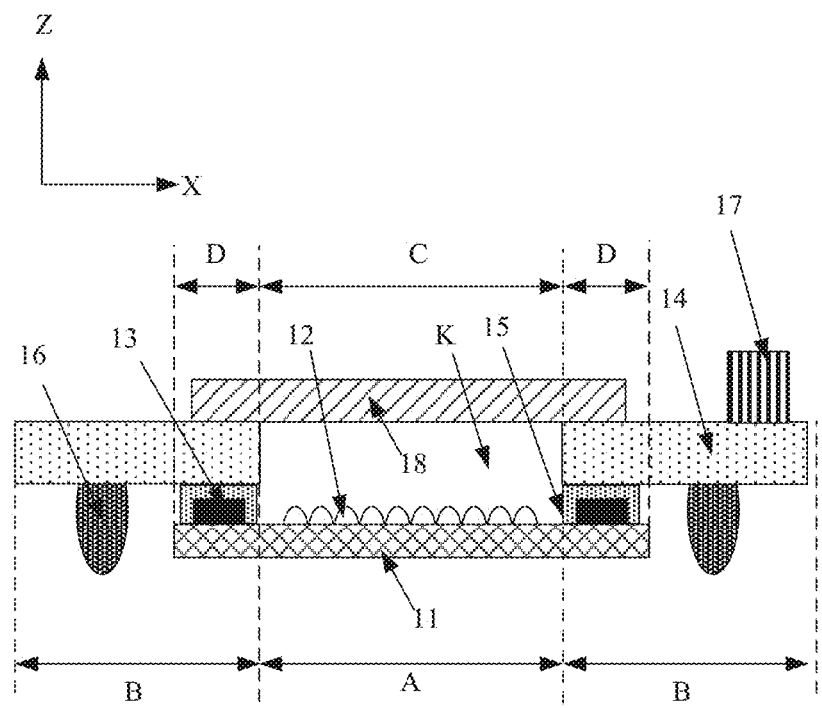
FIG. 4 is a schematic diagram of another structure for packaging an image sensor chip according to an embodiment of the present disclosure.

The structure for packaging according to an embodiment of the present disclosure may be as shown in FIG. 4, which 4 is a schematic diagram of another structure for packaging an image sensor chip according to an embodiment of the present disclosure. In the structure as shown in FIG. 4, the substrate 14 is made of a non-transparent material. In such case, the first region A is provided with an opening K running the substrate 14. The opening K is configured to expose all the pixels 12. Since the substrate 14 is made of the non-transparent material, a light shielding layer is unnecessary.

In a case that the substrate 14 is made of the non-transparent material, the substrate 14 may be a PCB substrate, a non-transparent plastic substrate, or a semiconductor substrate. In such case, the structure further includes a transparent cover plate 18 fixedly arranged on the substrate 14. The transparent cover plate 18 covers the opening K. The transparent cover plate 18 may be made of a tempered glass. The substrate 14 may be a single layer or a multi-layer stacking structure. Correspondingly, the first interconnection wiring and/or the second interconnection wring may be a single layer or a multi-layer stacking structure.

In a case that the substrate 14 is a PCB substrate or a non-transparent plastic substrate and the first interconnection wiring and the second interconnection wiring are multi-layer stacking structures, the first interconnection wiring and/or the second interconnection wiring may include multiple metal wiring layers and a connecting structure interconnects adjacent metal wiring layers. The connecting structure may be a metal plug or a through-hole structure.

In a case that the substrate 14 is a semiconductor substrate, the first interconnection wiring and/or the second interconnection wiring may include a through-hole structure for interconnection and a metal re-wiring layer. The through-hole structure for interconnection runs through the semiconductor substrate. The metal re-wiring layer is located on the first surface and/or the second surface of the semiconductor substrate, and is electrically connected with the through-hole structure for interconnection.

A quantity of the first interconnection wiring is more than one (≥2), and a quantity of the second interconnection wiring is more than one (≥2). Different first connecting wiring lines and/or second interconnection wiring are isolated and mutually insulated. The quantities and wiring manners of the first interconnection wiring and the second interconnection wiring are arranged according to an electronic component that is required to connect with the external circuit.

Figure 5:
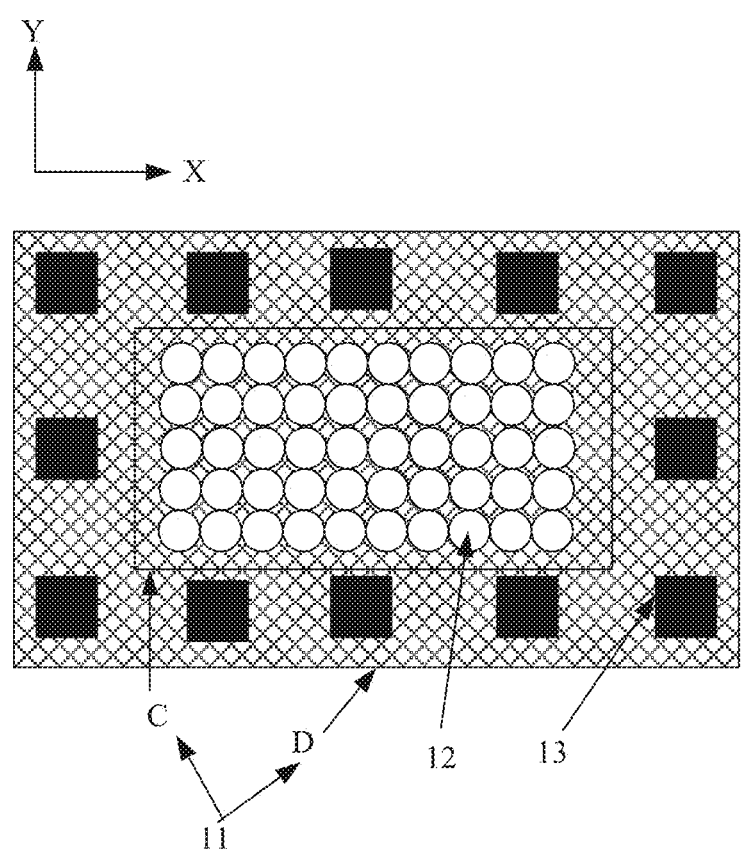
FIG. 5 is a top view of an image sensor chip according to an embodiment of the present disclosure.

Reference is made to FIG. 5, which is a top view of an image sensor chip according to an embodiment of the present disclosure. In one embodiment as shown in FIG. 5, the first bonding pads 13 of the image sensor chip 11 are arranged evenly along the periphery of the image sensor chip 11. The first bonding pads 13 are located in the non-collecting region D of the image sensor chip 11. The collecting region C is surrounded by the first bonding pads 13. In this embodiment, the first bonding pads 13 are arranged evenly along the periphery of the image sensor chip 11. Thereby in a case that the anisotropic conductive adhesive 15 is applied to bond the image sensor chip 11 to the substrate 14, pressure of the periphery of the image sensor chip 11 on the anisotropic conductive adhesive 15 is uniformly distributed. Thus, an effect of bonding and fixing the substrate 14 and the image sensor chip 11 is ensured. Prevented are problems due to an uneven distribution of the pressure of the image sensor chip 11 on the anisotropic conductive adhesive 15, such as overflowing glue due to an excessive local pressure or a poor bonding effect due to a deficient local pressure.

Figure 6:
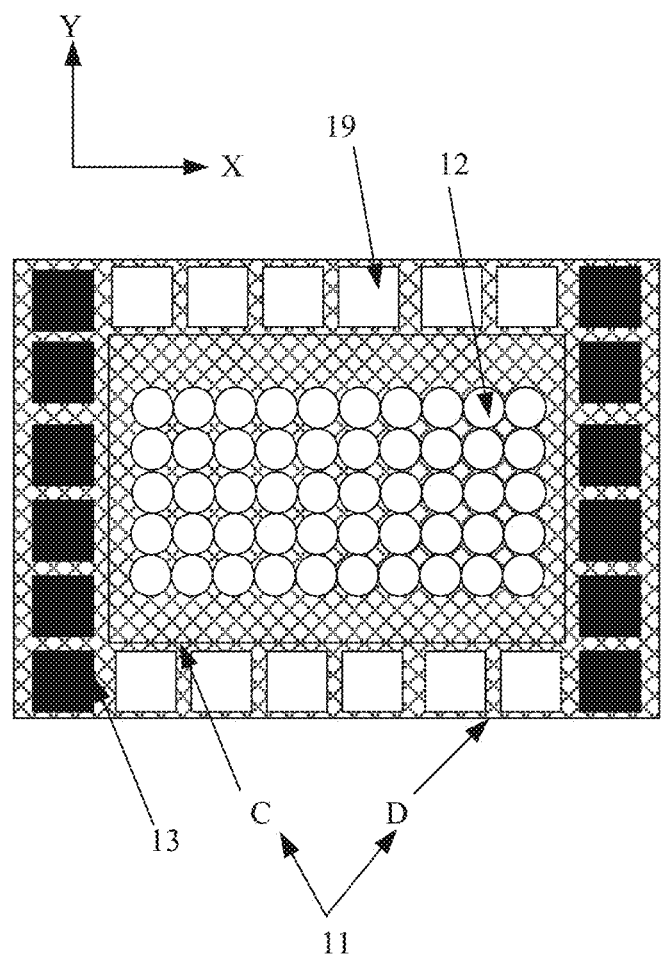
FIG. 6 is a top view of another image sensor chip according to an embodiment of the present disclosure.

Reference is made to FIG. 6, which is a top view of another image sensor chip according to an embodiment of the present disclosure. In one embodiment as shown in FIG. 6, the first surface of the image sensor chip 11 is provided with multiple auxiliary pads 19. The auxiliary pads 19 and the first bonding pads 13 are identical in shape. The auxiliary pads 19 and the first bonding pads 13 are evenly arranged along the peripheral of the image sensor chip.

The auxiliary pads 19 and the first bonding pads 13 are evenly arranged along the peripheral of the image sensor chip 11. In a case that the anisotropic conductive adhesive 15 is applied to bond the image sensor chip 11 to the substrate 14, pressure of the periphery of the image sensor chip 11 on the anisotropic conductive adhesive 15 is evenly distributed due to the auxiliary pads 19. Thus, an effect of bonding and fixing the substrate 14 and the image sensor chip 11 is ensured. Prevented are problems due to an uneven distribution of the pressure of the image sensor chip 11 on the anisotropic conductive adhesive 15, such as overflowing glue due to an excessive local pressure or a poor bonding effect due to a deficient local pressure. A distance between a first bonding pad 13 and an auxiliary pad 19, a distance between two first bonding pads 13, and a distance between two auxiliary pads 19 are same.

In this as shown in FIG. 6, the auxiliary pads 19 and the first bonding pads 13 are located on a periphery of a same rectangle. The multiple first bonding pads 13 are symmetrically arranged at two opposite sides of the rectangle, and the auxiliary pads 19 are symmetrically arranged at the other two opposite sides of the rectangle.

Figure 7:
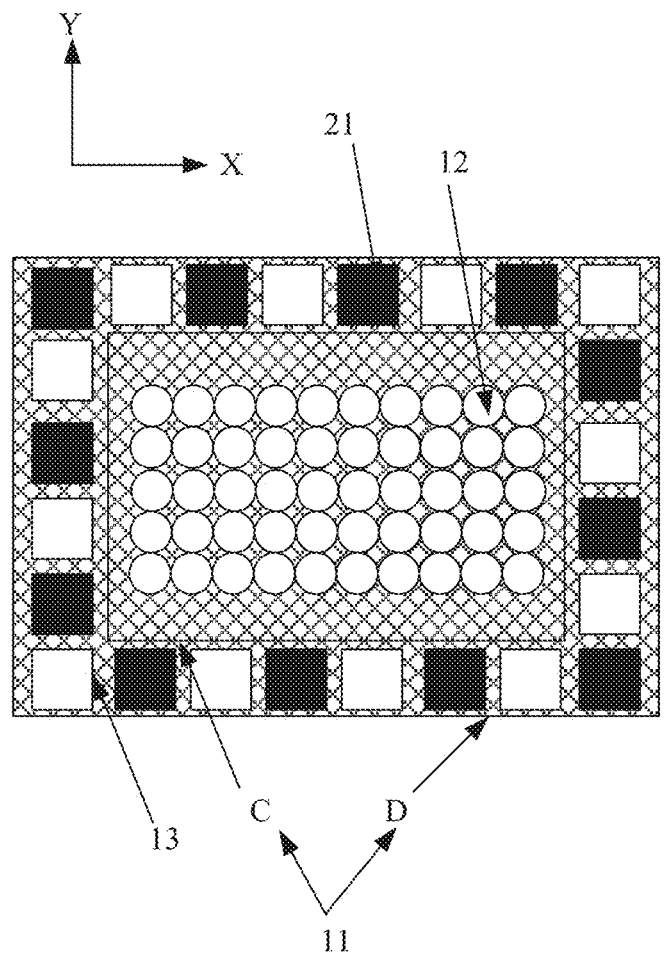
FIG. 7 is a top view of yet another image sensor chip according to an embodiment of the present disclosure.

Reference is made to FIG. 7, which is a top view of an image sensor chip according to another embodiment of the present disclosure. In one embodiment as shown in FIG. 7, the auxiliary pads 19 and the first bonding pads 13 are also located on a periphery of a same rectangle. A difference between FIG. 7 and FIG. 6 lies in that the auxiliary pads 19 and the first bonding pads 13 are alternatively arranged. Each distance between a first bonding pad 13 and an auxiliary pad 19 is same.

In the conventional technology, it is necessary to thin the chip in packaging, so as to obtain a chip packaging structure with a small thickness. Specifically, the chip is thinned through mechanical grinding or chemical etching. Mechanical strength of the chip is poor after the thinning.

In the structure according to one embodiment of the present disclosure, the image sensor chip 11 is thinned from a surface thereof that is away from the substrate 14. After the thinning, the surface of the image sensor chip 11 that is away from the substrate 14 is provided with a reinforcing layer. Mechanical strength of the reinforcing layer is greater than mechanical strength of the image sensor chip 11. Thus, the image sensor chip 11 may be thinned by a greater degree compared to the conventional technology, and the mechanical strength is enhanced via the reinforcing layer. Thereby, a thickness of the image sensor chip 11 can be greatly reduced while ensuring good mechanical strength of the structure for packaging the chip. In other words, compared with the structure of packaging in conventional technology, the structure for packaging according to the embodiment of the present disclosure enhance the thinning process to reduce a thickness of the image sensor chip 11. Thereby the image sensor chip 11 is thinner. The reinforcing layer of greater mechanical strength compensates the mechanical strength of the thinner image sensor chip 11, thereby realizing lightweight and small thickness of the structure for packaging the chip. Optionally, the reinforced layer may be made of a plastic material.

Based on the above description, the structure for packaging is provided according to the embodiment of the present disclosure. During packaging the image sensor chip 11 and the substrate 14, a soldering process is unnecessary. The image sensor chip 11 is directly fixed and bonded to the substrate 14 via the anisotropic conductive adhesive 15. The first bonding pads 13 are electrically connected with the wiring on the substrate 14 while the image sensor chip 11 is bonded to the substrate 14. The process is simple and the manufacturing cost is low. Further, by arranging the first bonding pads 13 or providing the auxiliary pads 19, the pressure of the periphery of the image sensor chip 11 on the anisotropic conductive adhesive 15 is evenly distributed, ensuring a bonding effect between the substrate 14 and the image sensor chip 11, and avoiding problems such as an overflowing glue or a poor bonding effect.

Based on the aforementioned embodiment of the structure for packaging, a method for packaging is provided according to an embodiment of the present disclosure, so as to package the image sensor chip and form the structure as described in the aforementioned embodiment. Reference is made to FIGS. 8 to 11, which are schematic diagrams of a process of a method for packaging according to an embodiment of the present disclosure. A method for packaging includes the steps S11 to S13.

Figure 8:
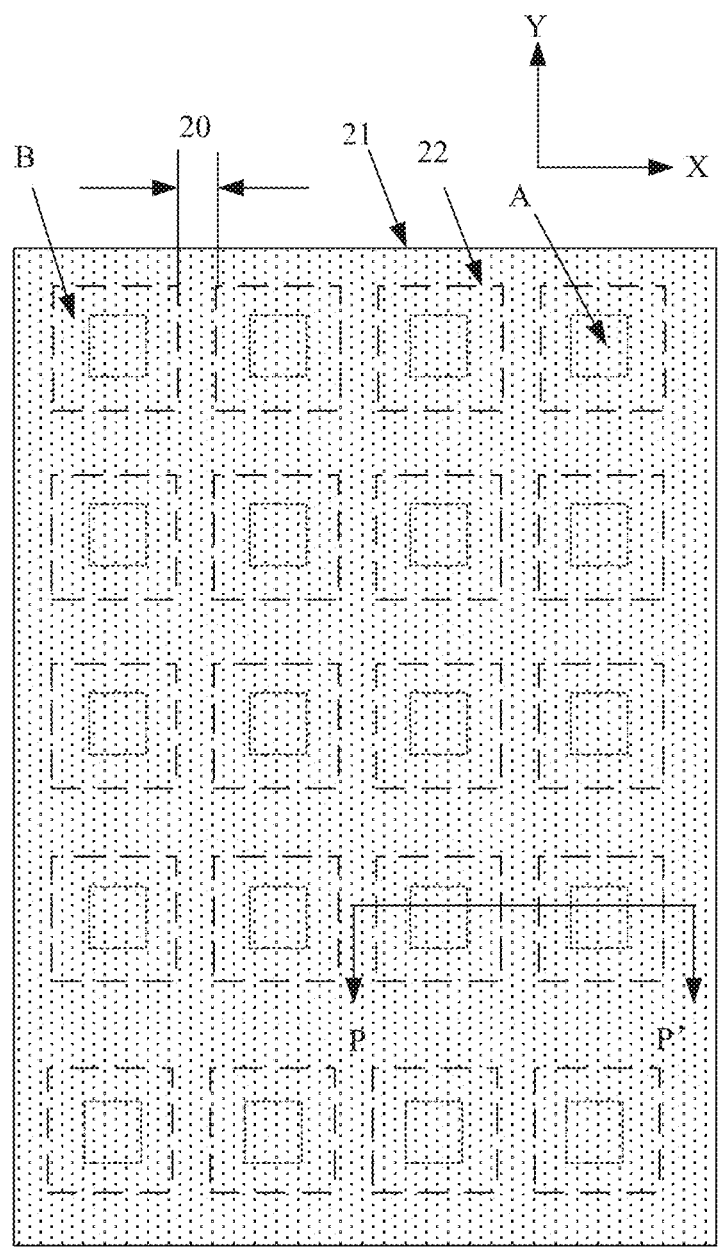
FIGS. 8-11 are schematic diagrams of a process of a method for packaging according to an embodiment of the present disclosure.
Figure 9:
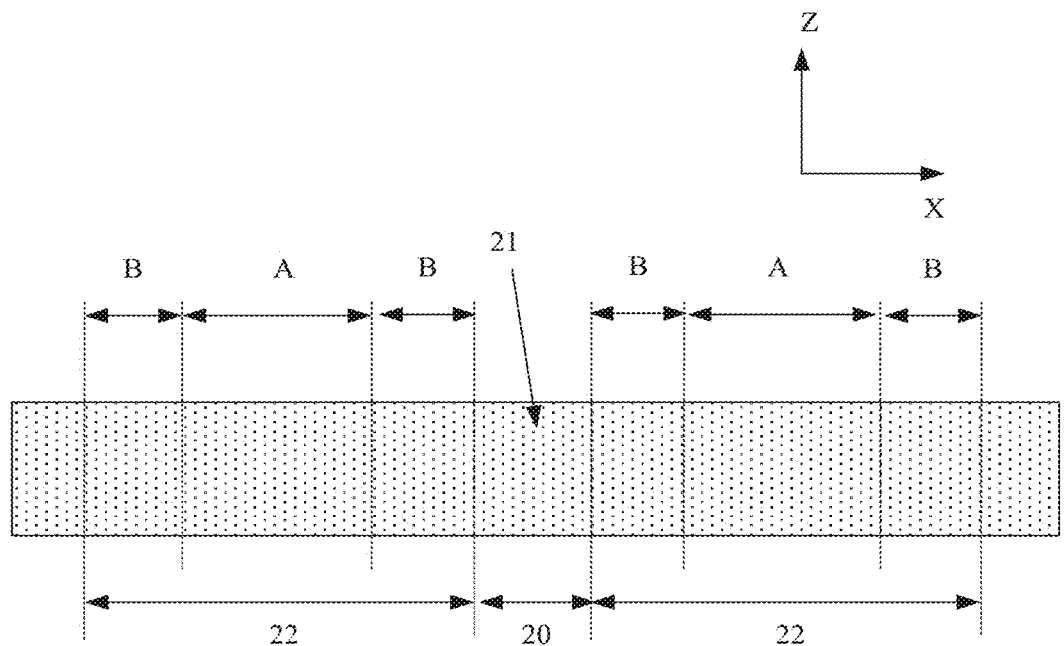

In step S11 as shown in FIGS. 8 and 9, a plate 21 is provided. The plate 21 includes multiple packaging regions 22 arranged in an array, and a cutting channel 20 is provided among adjacent packaging regions 22.

FIG. 8 is a top view of the plate 21, and FIG. 9 is a sectional view of the plate 21 along a direction of PP' in FIG. 8. Each packaging region 22 includes a first region A and a second region B surrounding the first region A. The first region A is a transparent region. In a subsequent step, the plate 21 is divided into multiple substrates 14 after cutting.

The packaging region 22 is arranged with wiring and a contact terminal electrically connected with the wiring. The wiring is configured to electrically connect with an external circuit. The wiring and the contact terminal are not shown in FIG. 8.

In one embodiment as shown in FIGS. 8 to 11, the plate 21 made of a transparent material is taken as an example for illustration. In a case that the plate 21 is made of the transparent material, the step of providing a plate includes following steps. A light shielding layer with a preset pattern structure is formed on a surface of the plate 21, where the light shielding layer with a preset pattern structure is provided with an opening corresponding to the first region A, and the opening is configured to expose the corresponding first region. The wiring and the contact terminal are formed on a surface of the light shielding layer that is away from the plate.

In forming the light shielding layer with the preset pattern structure, a mask with a preset pattern structure may be applied to form the light shielding layer with the preset pattern structure through an evaporation process, a photolithography process, or a screen printing process. In forming the wiring, a screen printing process may be applied.

Figure 10:
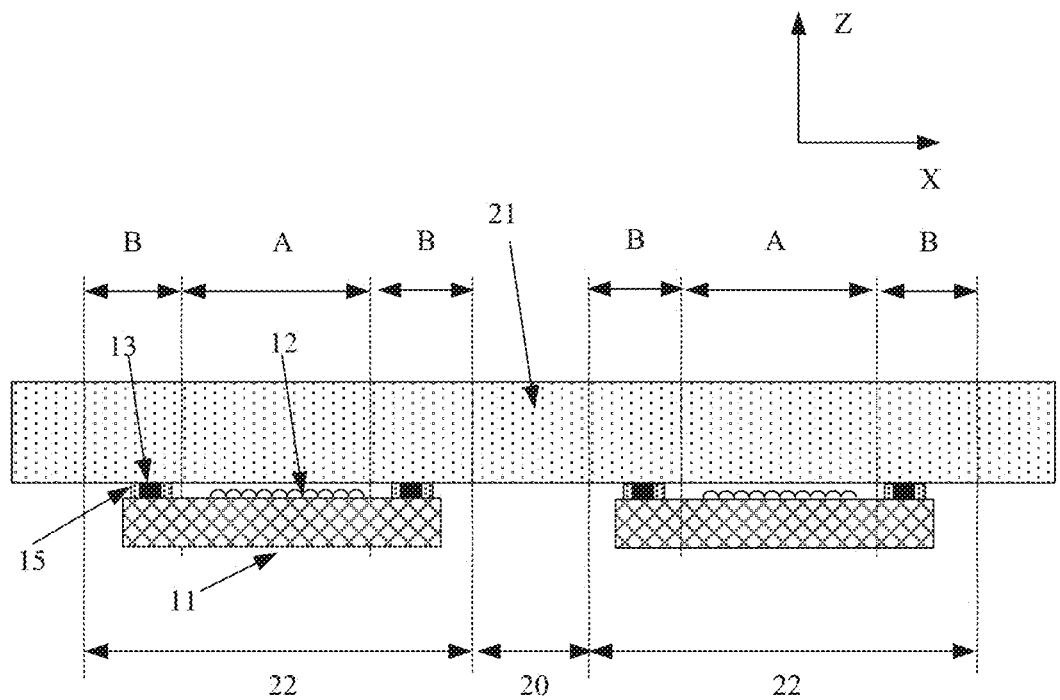

In step S12 as shown in FIG. 10, an image sensor chip 11 is bonded at each packaging region 22 via an anisotropic conductive adhesive 17.

The image sensor chip 11 includes a first surface and a second surface that are opposite to each other. The first surface is provided with multiple pixels 12 configured to collect image information and multiple first bonding pads 13 connected with the multiple pixels 12.

The first surface of the image sensor chip 11 includes a collecting region and a non-collecting region surrounding the collecting region. The collecting region faces the first region A, and the first bonding pads 13 are located in the non-collecting region. The image sensor chip 11 may refer to the aforementioned structure embodiments, and is not described again herein.

Specifically, the step of bonding an image sensor chip 11 at each multiple packaging region 22 via an anisotropic conductive adhesive 15 includes following steps. The anisotropic conductive adhesive 15 is coated on a periphery of each packaging region 22. The image sensor chip 11 is adhered to the anisotropic conductive adhesive 15. A hot-pressing consolidation process is performed on the anisotropic conductive adhesive 15, to fix the image sensor chip 11 to the substrate 14 via the anisotropic conductive adhesive 15 and electrically connect the image sensor chip 11 to the first bonding pads 13. The anisotropic conductive adhesive 15 is located between the non-collecting region and the second region B. The anisotropic conductive adhesive 15 is conductive in a direction perpendicular to the substrate 14, and is electrically insulating in a direction parallel to the substrate 14.

In step S13, the plate 21 is cut along the cutting channel 20, to form multiple structures for packaging the image sensor chip.

Figure 11:
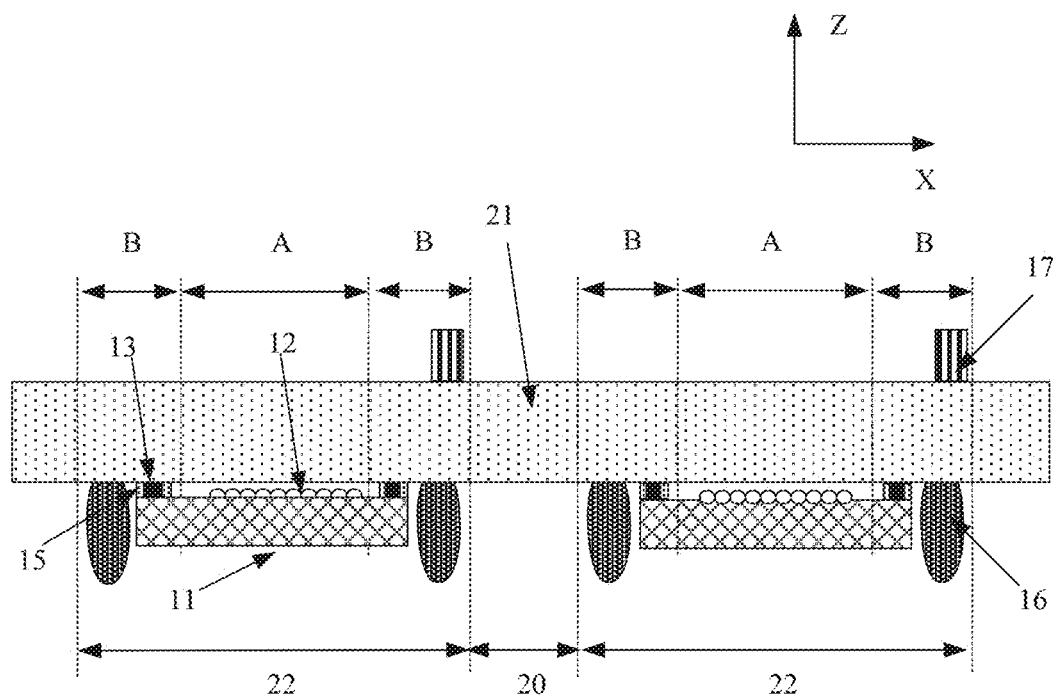

As shown in FIG. 11, before the cutting, the method further includes a following step. An external connection terminal 16 that is electrically connected with the wiring in each packaging region 22 is formed. The external connection terminal 16 is configured to electrically connect with the external circuit. The external connection terminal 16 and the image sensor chip 11 are located at a same side of the plate 21. After fixing the image sensor chip 11 at the packaging region 22 and before the cutting, the method for packaging further includes a following step. A light compensation apparatus 17 is provided on a surface of each packaging region 22 that is away from the image sensor chip 11.

After bonding the image sensor chip 11 at each packaging region 22 and before the cutting process, the method for packaging further includes following steps. The image sensor chip 11 is thinned form a surface thereof that is away from the plate 21. A reinforcing layer is formed on the surface of the image sensor chip 11 that is away from the plate 21 after the thinning.

After the cutting, the plate 21 is divided into the multiple substrates 14, and each substrate 14 includes a packaging region 22. The periphery of the image sensor chip 11 is bonded to the packaging region 22 via the anisotropic conductive adhesive 15. The first bonding pads 13 are electrically connected with the contact terminal via the anisotropic conductive adhesive 15. For each packaging region 22, the anisotropic conductive adhesive 15 surrounds all the pixels 12 and is not overlapped with the pixels 12 in a direction perpendicular to the packaging region. The structure for packaging after the cutting is as shown in FIG. 1.

In the method for packaging as shown in FIGS. 8 to 11, the plate 21 made of a transparent material is taken as an example for illustration. Namely, the substrate 14 is made of the transparent material. After the cutting, a position of each substrate 14 corresponding to the collecting region of the image sensor chip 11 is transparent.

In a case that the plate 21 is made of a non-transparent material, namely, the substrate 14 is made by a non-transparent material, it is necessary to form an opening at a position of the plate 21 corresponding to the collecting region of each image sensor chip 11. A transparent cover plate is fixedly arranged above the opening after bonding the image sensor chip 11 at the packaging region 22.

In the case that the substrate 14 is made of the non-transparent material, the method for packaging may be as shown in FIGS. 12 to 15. FIGS. 12 to 15 are schematic diagrams of a process of another method for packaging according to an embodiment of the present disclosure. A method for packaging includes the steps S21 to S25.

Figure 12:
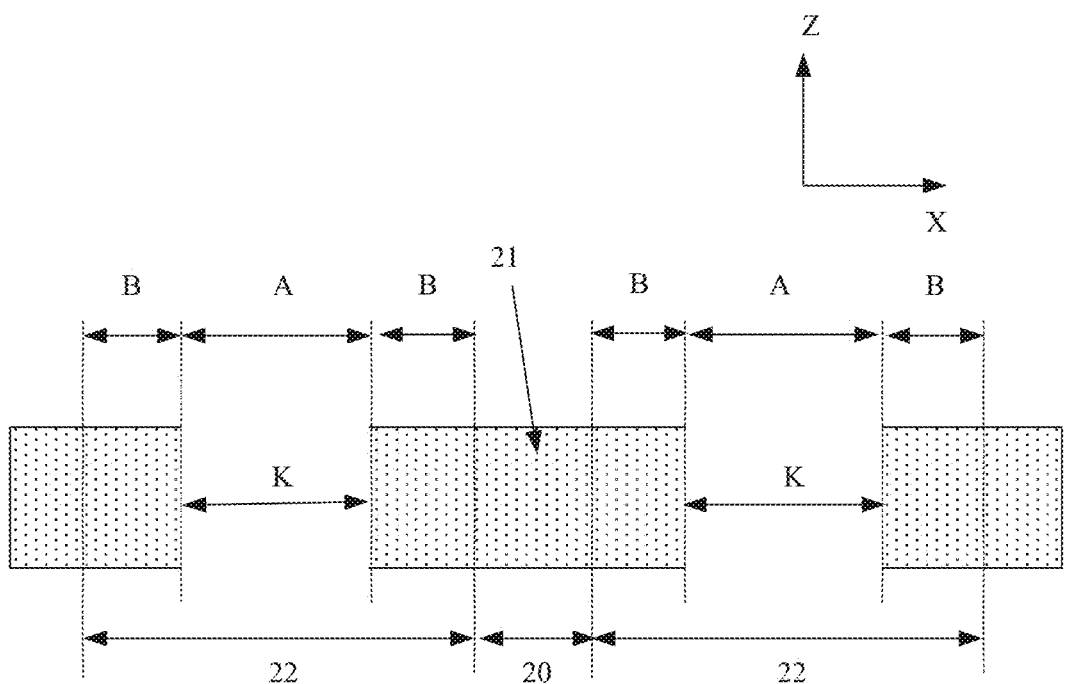
FIG. 12-15 are schematic diagrams of a process of another method for packaging according to an embodiment of the present disclosure.

In step S21 as shown in FIG. 12, a plate 12 is provided, where the plate 12 is made of a non-transparent material.

The plate 21 also includes multiple packaging regions 22. A cutting channel 20 is provided among packaging regions 22. Each packaging region 22 includes a first region A and a second region B.

In such case, an opening K running through the packaging region 22 in a first direction Z is formed in the first region A of each packaging region 22. The opening K is configured to expose all pixels of the image sensor chip.

Figure 13:
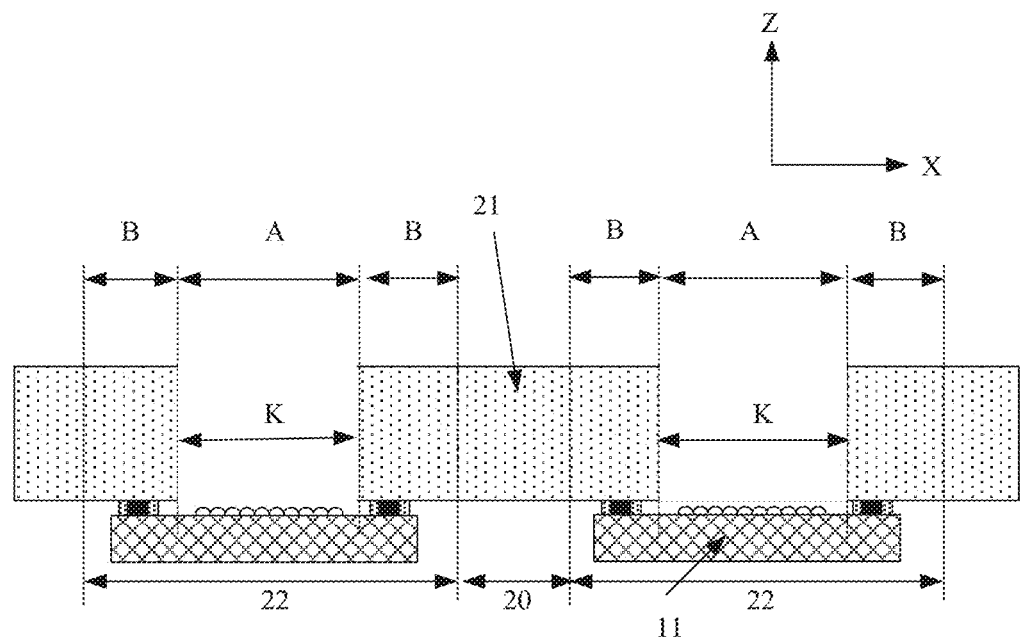

In step S22 as shown in FIG. 13, an image sensor chip 11 is bonded at each packaging region 22 via an anisotropic conductive adhesive.

Figure 14:
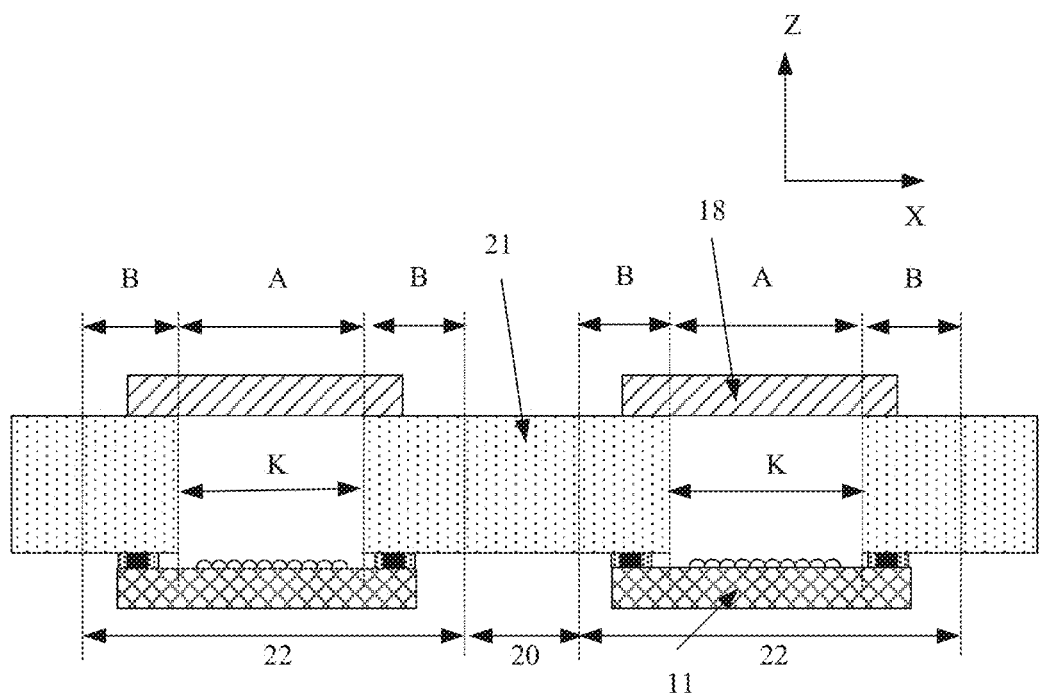

In step S23 as shown in FIG. 14, a transparent cover plate 18 is fixedly arranged on each opening K.

Figure 15:
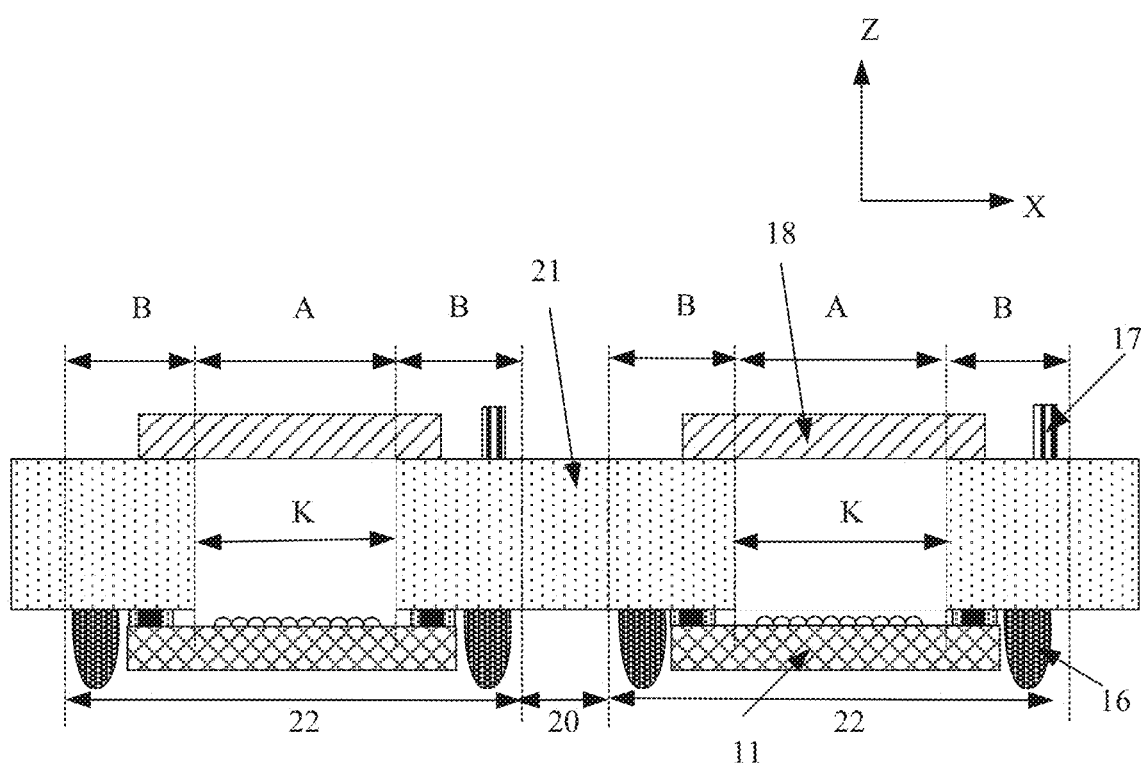

In step S24 as shown in FIG. 15, an external connection terminal 16 that is electrically connected with the wiring is formed at each packaging region 22. A light compensation apparatus 17 is arranged on a surface of each packaging region 22 that is away from the image sensor chip 11.

In step S25, the plate 21 is cut along the cutting channel 20, to form multiple structures for packaging of the image sensor chip. The structure after the cutting is as shown in FIG. 4.

The method for packaging according to embodiments of the present disclosure may be applied to package an image sensor chip, so as to form the aforementioned structure for packaging. In packaging the image sensor chip 11 and the plate 21, a soldering process is unnecessary, and thereby the process is simple and the manufacturing cost is low.

The embodiments of the present disclosure are described in a progressive manner, and each embodiment places emphasis on the difference from other embodiments. Therefore, one embodiment can refer to other embodiments for the same or similar parts. Since packaging methods disclosed in the embodiments corresponds to packaging structures disclosed in the embodiments, the description of packaging methods is simple, and reference may be made to the relevant part of packaging structures.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A structure for packaging an image sensor chip, comprising:

an image sensor chip, wherein the image sensor chip comprises a first surface and a second surface that are opposite to each other, and the first surface is provided with a plurality of pixels configured to collect image information and a plurality of first bonding pads connected with the plurality of pixels; and a substrate covering the first surface of the image sensor chip, wherein the substrate is provided with wiring and a contact terminal connected with the wiring, and the wiring is configured to electrically connect with an external circuit;

wherein a periphery of the image sensor chip is bonded to the substrate via an anisotropic conductive adhesive, the plurality of first bonding pads is electrically connected with the contact terminal via the anisotropic conductive adhesive, and the anisotropic conductive adhesive surrounds all the plurality of pixels and is not overlapped with the plurality of pixels in a direction perpendicular to the substrate, wherein the direction perpendicular to the substrate refers to a direction pointing from the image sensor chip to the substrate.

2. The structure according to claim 1, wherein:

the substrate comprises a first region and a second region surrounding the first region, and the first region is a transparent region;

the first surface of the image sensor chip comprises a collecting region and a non-collecting region surrounding the collecting region, wherein the collecting region faces the first region, and the plurality of first bonding pads are located in the non-collecting region; and the anisotropic conductive adhesive is located between the non-collecting region and the second region.

3. The structure according to claim 2, wherein the substrate is made of a transparent material.

4. The structure according to claim 3, wherein the wiring is located on a surface of the second region that faces the image sensor chip, and a light shielding layer is provided between the wiring and the substrate.

5. The structure according to claim 2, wherein the substrate is made of a non-transparent material, the first region is provided with an opening running through the substrate, and the opening is configure to expose all of the plurality of pixels.

6. The structure according to claim 5, further comprising a transparent cover plate fixedly arranged on the substrate, wherein the transparent cover plate covers the opening.

7. The structure according to claim 1, wherein an external connection terminal is arranged on a surface of the substrate that faces the image sensor chip, wherein the external connection terminal is electrically connected with the wiring, and the external connection terminal is configured to electrically connect with the external circuit.

8. The structure according to claim 7, wherein the external circuit comprises a socket, the external connection terminal is a pin matching with the socket, and the wiring is connected with the external circuit through plugging the pin into the socket.

9. The structure according to claim 1, further comprises a light compensation apparatus arranged on a surface of the substrate that is away from the image sensor chip.

10. The structure according to claim 1, wherein the plurality of first bonding pads is evenly arranged along the periphery of the image sensor chip.

11. The structure according to claim 1, wherein the first surface of the image sensor chip is provided with a plurality of auxiliary pads, the plurality of auxiliary pads is identical to the plurality of first bonding pads in shape, and the plurality of auxiliary pads and the plurality of first bonding pads are evenly arranged along the peripheral of the image sensor chip.

12. The structure according to claim 11, wherein the plurality of auxiliary pads and the plurality of first bonding pads are located along a periphery of a rectangle, the plurality of first bonding pads is evenly arranged along two opposite sides of the rectangle, and the plurality of auxiliary pads are evenly arranged along another two opposite sides of the rectangle.

13. The structure according to claim 11, wherein the plurality of auxiliary pads and the plurality of first bonding pads are located along a periphery of a rectangle, and the plurality of first bonding pads and the plurality of auxiliary pads are arranged along the periphery of the rectangle in an alternating manner.

14. A method for packaging an image sensor chip, configured to manufacture the structure according to claim 1, comprising:
providing a plate, wherein the plate comprises a plurality of packaging regions arranged in an array, a cutting channel is provided among adjacent ones of the plurality of packaging regions, each of the plurality of packaging regions is provided with the wiring and the contact terminal connected with the wiring, and the wiring is configured to electrically connect with the external circuit;
bonding the image sensor chip at each of the plurality of packaging regions via the anisotropic conductive adhesive, wherein the image sensor chip comprises the first surface and the second surface that are opposite to each other, and the first surface is provided with the plurality of pixels configured to collect image information and the plurality of first bonding pads connected with the plurality of pixels;
cutting the plate along the cutting channel, to form a plurality of structures for packaging the image sensor chip, wherein the plate is divided into a plurality of substrates in the cutting, and each of the plurality of substrates comprises one of the plurality of packaging regions;
wherein the periphery of the image sensor chip is bonded to the substrate via the anisotropic conductive adhesive, and the plurality of first bonding pads is electrically connected with the contact terminal via the anisotropic conductive adhesive, and
wherein for each of the plurality of packaging regions, the anisotropic conductive adhesive surrounds all the plurality of pixels and is not overlapped with the plurality of pixels in a direction perpendicular to said packaging region, wherein the direction perpendicular to the substrate refers to a direction pointing from the image sensor chip to the substrate.

15. The method according to claim 14, wherein:
each of the plurality of packaging regions comprises a first region and a second region surrounding the first region, and the first region is a transparent region;
the first surface of the image sensor chip comprises a collecting region and a non-collecting region surrounding the collecting region, wherein the collecting region faces the first region, and the plurality of first bonding pads are located in the non-collecting region;
bonding the image sensor chip at each of the plurality of packaging regions via the anisotropic conductive adhesive comprises:
coating the anisotropic conductive adhesive on a periphery of each of the plurality of packaging regions;
adhering the image sensor chip to the anisotropic conductive adhesive; and
performing a hot-pressing consolidation process on the anisotropic conductive adhesive, to fix the image sensor chip to the substrate via the anisotropic conductive adhesive; and
the anisotropic conductive adhesive is located between the non-collecting region and the second region.

16. The method according to claim 15, wherein the plurality of substrates is made of a transparent material; and
wherein providing a plate comprises:
forming a light shielding layer with a preset pattern structure on a surface of the plate, wherein the light shielding layer with the preset pattern structure is provided with openings in a one-to-one correspondence to the first regions, and the openings are configured to expose the corresponding first region; and
forming the wiring and the contact terminal on a surface of the light shielding layer that is away from the plate.

17. The method according to claim 15, wherein the plurality of substrates is made of a non-transparent material; and
wherein providing a plate comprises:
forming, at the first region of each of the plurality of packaging regions, an opening running through said packaging region, wherein the opening is configured to expose all the plurality of pixels.

18. The method according to claim 17, further comprising:
fixing a transparent cover plate on each of the openings.

19. The method according to claim 14, wherein before cutting the plate along the cutting channel, the method further comprises:
providing a light compensation apparatus on a surface of each of the plurality of packaging regions that is away from the image sensor chip.

20. The method according to claim 14, wherein before cutting the plate along the cutting channel, the method further comprises:
forming an external connection terminal electrically connected with the wiring at each of the plurality of packaging regions, wherein the external connection terminal is configured to electrically connect with the external circuit, and the external connection terminal and the image sensor chip are located at a same side of the plate.

* * * * *